United States Patent [19]
Kyles

[11] Patent Number: 6,028,462
[45] Date of Patent: Feb. 22, 2000

[54] TUNABLE DELAY FOR VERY HIGH SPEED

[75] Inventor: Ian Kyles, West Linn, Oreg.

[73] Assignee: LSI Logic Corporation, Milpitas, Calif.

[21] Appl. No.: 08/916,819

[22] Filed: Aug. 22, 1997

[51] Int. Cl.[7] .................................................. H03H 11/26
[52] U.S. Cl. ............................................................ 327/277
[58] Field of Search .................................... 327/269, 270, 327/271, 272, 276, 277, 278, 281, 165, 99; 375/359, 355

[56] References Cited

U.S. PATENT DOCUMENTS

| | | | |
|---|---|---|---|
| 4,965,535 | 10/1990 | Neuman | 331/116 FE |
| 5,095,233 | 3/1992 | Ashby et al. | 327/276 |
| 5,142,249 | 8/1992 | Hirotomi | 331/57 |
| 5,175,512 | 12/1992 | Self | 331/57 |
| 5,208,557 | 5/1993 | Kersh, III | 331/57 |
| 5,272,453 | 12/1993 | Traynor et al. | 331/57 |
| 5,349,311 | 9/1994 | Mentzer | 331/57 |
| 5,416,446 | 5/1995 | Holler et al. | 331/57 |
| 5,446,417 | 8/1995 | Korhonen et al. | 331/57 |
| 5,477,198 | 12/1995 | Anderson et al. | 331/177 R |
| 5,563,553 | 10/1996 | Jackson | 331/57 |
| 5,629,652 | 5/1997 | Weiss | 331/108 B |
| 5,686,867 | 11/1997 | Sutardja | 331/57 |
| 5,719,514 | 2/1998 | Sato | 327/276 |
| 5,729,158 | 3/1998 | Rajivan et al. | 327/276 |
| 5,781,056 | 7/1998 | Fujii | 327/76 |

OTHER PUBLICATIONS

Vitesse Semiconductor Corporation, *Design Guide VSC7125*, Sep. 25, 1995, pp. 1–6.
Vitesse Semiconductor Corporation, *Advanced Product Information VSC7126*, Oct. 21, 1996, pp. 1–13.

*Primary Examiner*—My-Trang Nuton

[57] ABSTRACT

A circuit and method are shown for a continuously adjustable delay circuit. The present invention utilizes two signal delay paths controlled by a tuning signal wherein each delay path receives a reference signal. The first delay path delays the reference signal in response to the tuning signal in a manner that is complementary to the manner in which the second delay path delays the reference signal in response to the tuning signal. By selecting one of the signal output by the first delay path and the signal output by the second delay path and switching between the two signals at a point when the two signals are separated by a period of the reference signal, a delay of the reference signal can be continuously adjusted.

21 Claims, 10 Drawing Sheets

TUNABLE DELAY FOR VERY HIGH SPEED

FIELD OF THE INVENTION

The present invention relates generally to the provision of a clocking signal in a communications transceiver.

BACKGROUND OF THE INVENTION

Digital data are often transferred across computer and telecommunications networks. A clock signal is required to synchronize both the transmission and reception of digital data in a communications device used to transfer the data. The clock signal is used by a transmitter to drive digital data onto a communications medium at a set frequency. The clock signal is used by a receiver to recover the transmitted data from the communications medium and drive the circuits which receive the data from the receiver.

Clock signals having high precision are desirable in order to transmit and receive without losing data. A precise transmit clock aids in the efficient and loss-free reception of the transmitted data because the data transmitted using the clock has a predictable transfer frequency with consistent data transition edge positions. Data transmitted using a transmit clock having jitter, i.e. random or systematic variation in an edge position relative to an ideal edge, or that is out-of-tolerance, i.e. the fundamental frequency of the data signal deviates from the ideal frequency, must be compensated for in the receiver and, if the receiver is unable to compensate then data can be lost. Thus, receivers require precise clocks that allow the receiver to compensate for variations in the phase and frequency of the incoming data signal or stream.

A typical device used to generate a precise clock frequency is Phase-Locked Loop (PLL). Transmitters use a PLL to synthesize a high frequency transmit clock from a lower frequency reference clock because of the difficulty in distributing the high frequency clock in the presence of noise and because of the higher power consumption of a higher speed clock. Receivers use a separate PLL to accommodate differences in the phase and frequency of the incoming data relative to a reference clock frequency. Each channel for transmission or reception therefore typically requires its own PLL along with the attendant pin-out, power and circuit area requirements. As a result, integrated circuits (ICs) which use multiple serial transmitters and receivers may become too large because of the separate PLLs required to create the local clock for each channel. Also, multiple PLLs on a single chip can interfere with one another and degrade their performance.

Figure 1:
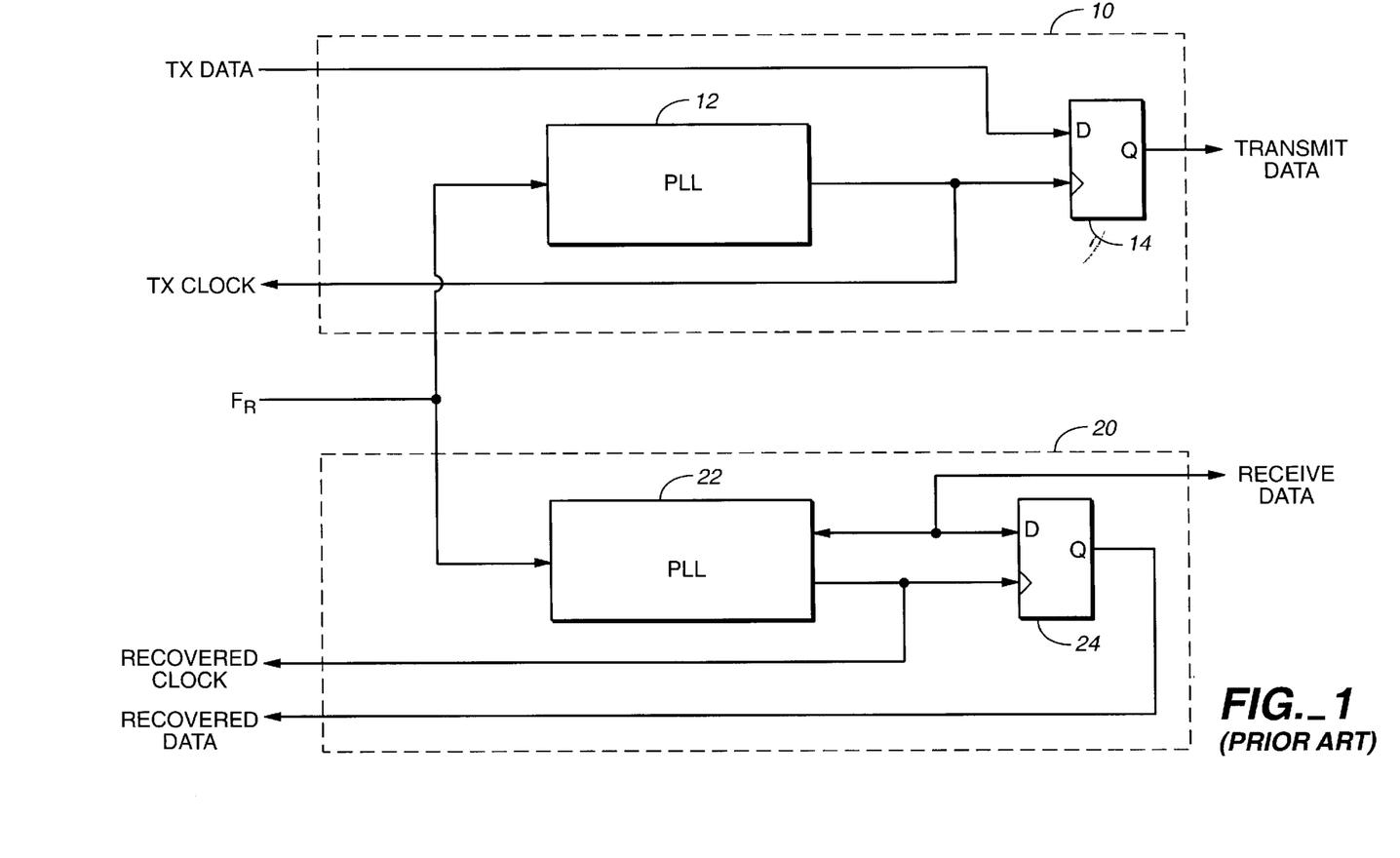
FIG. 1 is a block diagram of an embodiment of a prior art transmitter and receiver pair.

A conventional transmit and receive pair of the prior art is shown in FIG. 1. A transmitter 10 includes a PLL 12 which receives a reference frequency $F_R$ and generates a transmit clock TX CLOCK which drives the transmit data TX DATA through D flip-flop 14 onto the transmission medium as TRANSMIT DATA. TX CLOCK is also routed back to the circuit sending TX DATA to synchronize the transfer of TX DATA into transmitter 10.

A receiver 20 also includes a PLL 22 which receives the reference frequency $F_R$ and the received data RECEIVE DATA which has been transmitted by a device similar to transmitter 10. PLL 22 adjusts its phase responsive to RECEIVE DATA in order to recover the receive clock RECOVERED CLOCK which drives D flip-flop 24 to recover the receive data RECOVERED DATA from the RECEIVE DATA signal from the transmission medium. RECOVERED CLOCK is also routed to the circuit which receives the RECOVERED DATA signal in order to synchronize the transfer of RECOVERED DATA signal from receiver 20.

In the PLL 22 in receiver 20, while the reference frequency $F_R$ controls the fundamental frequency of PLL 22, the data transitions in the RECEIVE DATA signal adjust the phase of the RECOVERED CLOCK signal generated by the PLL 22 so that the edges of RECOVERED CLOCK signal are in synchronization with the transitions of the data in RECEIVE DATA signal.

Figure 2:
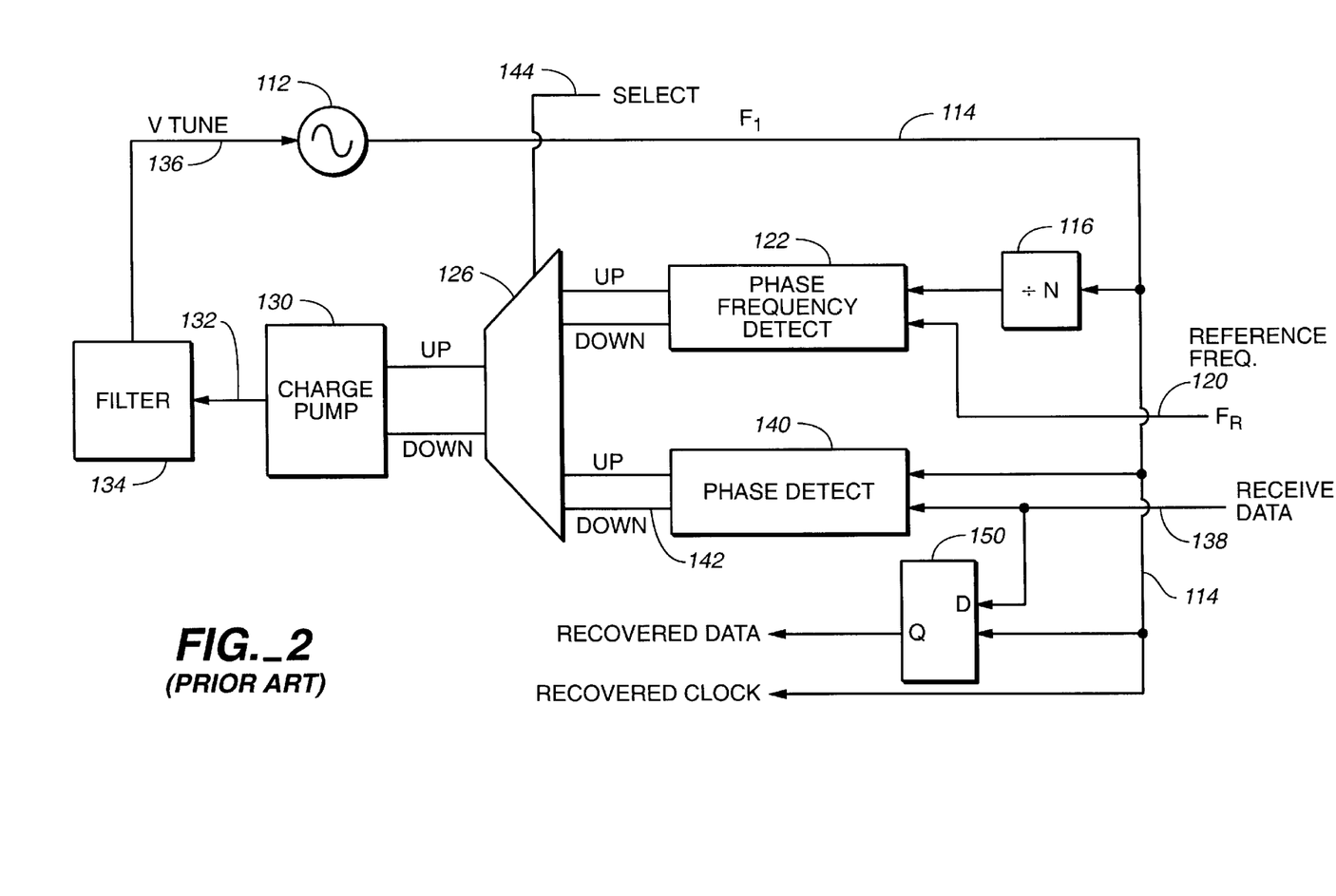
FIG. 2 is a schematic drawing of a receiver circuit according to the prior art.

FIG. 2 illustrates another embodiment, according to the prior art, of a serial receiver clock and data recovery circuit. A phase-locked loop circuit comprises a voltage controlled oscillator (VCO) 112 to provide a clock signal at line 114. The clock signal from the VCO is input to a divide-by-N circuit 116 to divide it down to a predetermined reference frequency. A reference frequency source $F_R$ (i.e. a reference clock signal) is input at line 120 and compared to the divide-by-N clock signal in a phase-frequency detector circuit 122. If the divided clock frequency is lower than the reference frequency $F_R$, the detector 122 asserts the "up" signal through multiplexer 126 to cause a charge pump 130 to increase a tune voltage for controlling the VCO 112. The charge pump output at line 132, typically an analog voltage, is input to a filter 134 and the filtered tuning voltage "VTune" is input to the VCO at line 136 to increase the clock frequency $F_1$ in an effort to match it to N times the reference frequency $F_R$.

Conversely, if and when the detector 122 determines that the clock frequency f/N is greater than the reference frequency $F_R$ at 120, it asserts a down "DOWN" signal through MUX 126 to the charge pump 130 in order to lower the tune voltage and thereby lower the frequency output by the oscillator 112. In this manner, the VCO 112, divide-by-N 116, detector 122, charge pump 130 and filter 134 form a closed loop (i.e. a phase-locked loop) for dynamically adjusting the VCO frequency in order to hold it to N times the reference frequency $F_R$. However, merely matching the frequency of a serial data stream is insufficient to accurately recover the data. The precise phase of the data stream must be taken into account as well. To illustrate, imagine the data stream consists of a series of alternating 1's and 0's much like a sine wave. If the recovered clock is out of phase, then every recovered data bit will be wrong.

To properly recover the serial clock and data, the incoming data stream at line 138 is compared to the clock frequency 114 in a phase detector circuit 140. Phase detector circuits of various types are known in the prior art and therefore are not described here in detail. If a given transition or "edge" of the clock signal 114 is ahead of or "leads" a corresponding edge of the data stream at 138, the detector circuit 140 asserts the down "DOWN" output 142. This control signal is conveyed through multiplexer 126 to the charge pump 130 to affect a slight downward adjustment of the tune voltage at line 132 which, in turn, slightly lowers the frequency of the clock signal output by the VCO 112 to move into closer synchronization with the serial data stream. Conversely, when the clock signal 114 lags behind the data stream at 138, detector circuit 140 asserts the "UP" signal through MUX 126 to cause the charge pump to slightly increase the tune voltage applied to the VCO, and thereby slightly increase the frequency of its output. Thus, the first detector 122 can be considered a coarse adjustment of the VCO loop in order to drive the VCO to the right frequency, while the phase detector 140 adjusts the phase of the clock signal 114 so as to synchronize it to the incoming data stream. Since these two signals are synchronized, the clock signal 114 provides the recovered clock signal and the recovered clock signal is used to clock flip flop 150 to recover data from the incoming data stream.

Multiplexer 126 is arranged for controllably selecting as control inputs to the charge pump 130, one at a time of the frequency detector 122 and, alternatively, the phase detector 140, in response to the select control signal 144. Generally, while a serial data stream is being received, the clock signal 114 is at the correct frequency, i.e., the frequency of the serial data stream, and the multiplexer 126 is set to couple the output of phase detector 140 to the charge pump, in order to keep the recovered clock signal synchronized to the data stream. If and when synchronization is lost, the select input 144 to the multiplexer 126 switches so as to apply the detector 122 output to the charge pump to force the VCO to N times the reference frequency. Having done so, the multiplexer can then switch back to the phase detector 140 to again synchronize with the data. In other words, when synchronization is lost, the circuit falls back to the reference frequency, temporarily, preparatory to resynchronizing to the data.

During normal operation, the phase detector 140 compares transitions in the recovered clock signal 114 to transitions in the data signal 138 as described above. This recovery technique works adequately as long as there are sufficient transitions in the data. In other words, if the data signal goes for a long time, say 50 or 100 bit units, without any transition, the tuning signal Vtune drifts and consequently the recovered clock signal frequency and phase drifts as well. Various protocols are known for encoding serial data, prior to transmission, so as to ensure that transitions occur within some predetermined maximum number of bit units. However, these encoding schemes increase overhead, and reduce effective bandwidth, and, obviously, they impose constraints on the nature of the data.

In addition, the phase of the clock within the RECEIVE DATA signal can drift beyond the range within which the clock recovery circuit can accommodate the drift. If the clock in the device transmitting the RECEIVE DATA signal is slightly greater or lesser than the specified Reference Frequency $F_R$, then the phase of the RECEIVE DATA signal will continuously lead or lag the RECOVERED CLOCK frequency causing the charge pump to attempt to keep moving Vtune. However, the tuning voltage Vtune has a limited range. Once the voltage level reaches a limit of the range of Vtune, it is no longer possible to adjust the output of VCO 112 in order to follow the drift in the clock within the RECEIVE DATA signal. This results in the loss of synchronization with the incoming RECEIVE DATA stream and, consequently, the loss of data.

Accordingly, a need remains for device which can continuously adjust a phase of a recovered clock without the loss of received data.

SUMMARY OF THE INVENTION

It is, therefore, an object of the invention to provide a circuit and method which can continuously adjust for changes in the phase of a signal.

An advantage of the present invention is that it can continuously adjust the delay in a signal without being bound by limits on the range of a tuning signal.

The foregoing and other objects, features and advantages of the invention will become more readily apparent from the following detailed description of a preferred embodiment of the invention which proceeds with reference to the accompanying drawings.

DETAILED DESCRIPTION

Figure 3A:
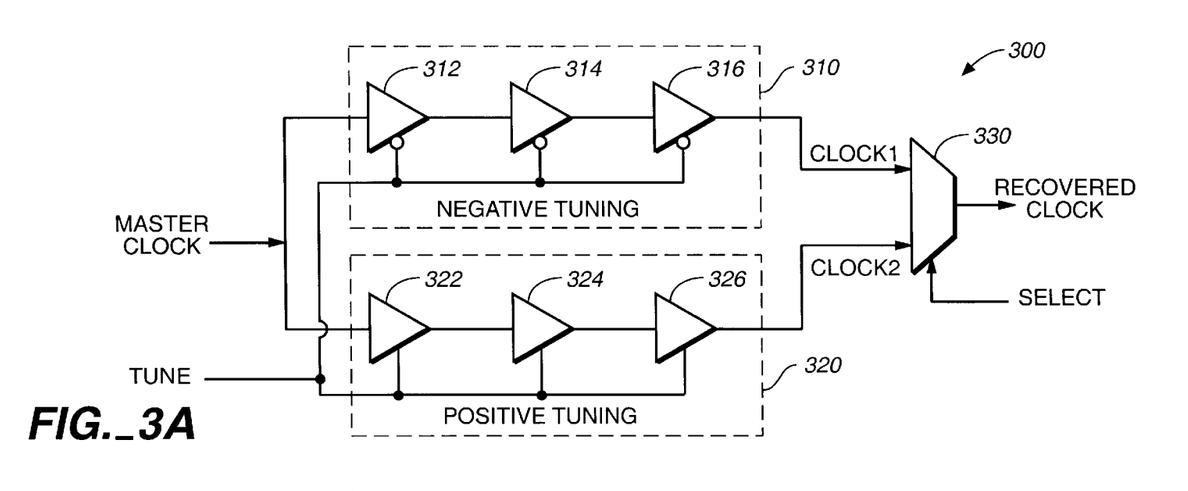
FIG. 3A is a functional block diagram of an embodiment of a continuously adjustable delay circuit according to the present invention.

FIG. 3A shows a continuously adjustable delay circuit 300 which is also described in the commonly assigned patent application entitled "CONTINUOUSLY ADJUSTABLE DELAY-LOCKED LOOP", herein incorporated by reference for all purposes. The continuously adjustable delay circuit 300 is constructed using two variable delay paths 310 and 320. The first delay path 310 is composed of delay elements 312, 314 and 316, which respond inversely to a TUNE control signal in order to generate a first delayed clock signal CLOCK1. The second delay path 320 is composed of delay elements 322, 324 and 326, which respond in direct relation to the TUNE signal in order to generate a second delayed clock signal CLOCK2.

Figure 3B:
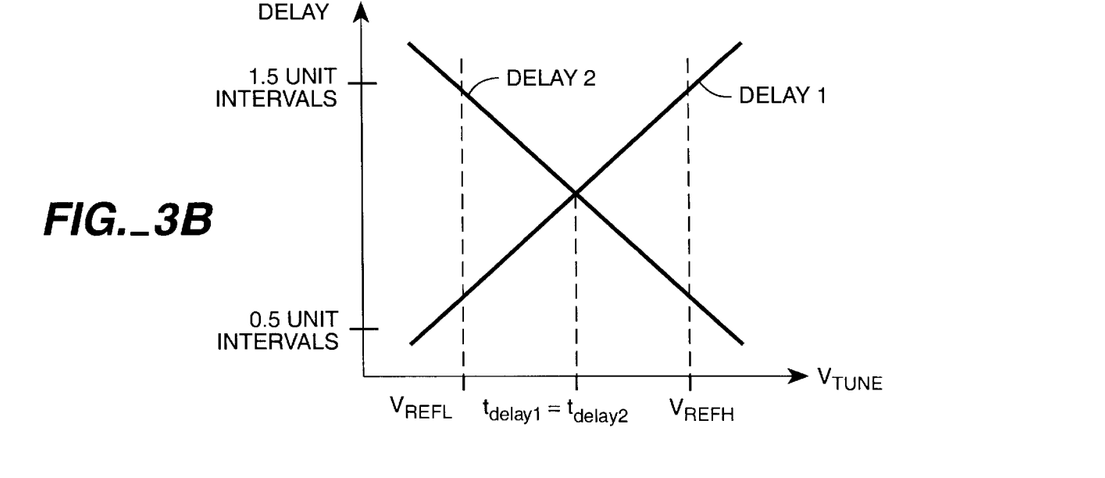
FIG. 3B is a plot of the relationship between the delay of each of the two delay paths of the continuously adjustable delay circuit of FIG. 3A and a tune control signal.

Delay paths 310 and 320 each receive a MASTER CLOCK signal which is delayed under the control of the TUNE signal to obtain CLOCK1 and CLOCK2 respectively. FIG. 3B demonstrates the relationship between the delay of CLOCK1 (DELAY1) and CLOCK2 (DELAY2) and the voltage $V_{TUNE}$ of the TUNE signal. Note that DELAY1 and DELAY2 are complementary to one another, i.e. when one path is adjusted to near its maximum delay, then the other path is set to near its minimum delay by the same value of $V_{TUNE}$.

In order to continue tuning the delay in the same direction, i.e. to continue slipping or advancing the clock signal, the clock signal must be switched between CLOCK1 and CLOCK2 at a point when difference between the delay of each delay path is equal to one bit period T, which can be represented by the expression $|t_{delay1} - t_{delay2}| = T$ or $\Delta t = T$. Switching between CLOCK1 and CLOCK2 is accomplished using multiplexor 330, which is driven by a SELECT signal, to select one of the CLOCK1 or CLOCK2 signals for output as the RECOVERED CLOCK Note here that although each of delay paths 310 and 320 is shown as consisting of three delay elements each, each data path can also be implemented in fewer, but larger, variable delay elements. However, the large number of gradations of a larger variable delay element typical results in a degradation of the delayed signal. Therefore, a larger number of smaller variable delay elements are used which have smaller gradient levels and therefore introduce less clock signal distortion.

Figure 4A:
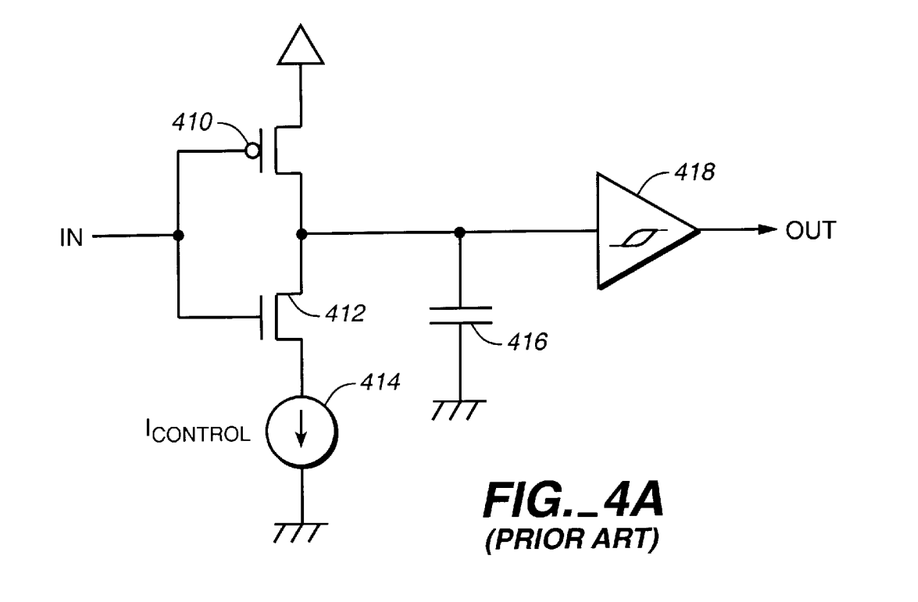
FIG. 4A is a circuit diagram of a prior art analog variable delay element suitable for use in the continuously adjustable delay circuit of FIG. 3A.

FIG. 4A shows an example of a prior art analog variable delay element suitable for use as one of the elements 312, 314, 316, 320, 324 or 326 in the continuously adjustable delay circuit 300 of FIG. 3A. A signal appearing at the input terminal IN is inverted by transistors 410 and 412 and applied to capacitor 416 connected to the input of Schmitt trigger 418. Current source 414, connected in series with transistor 410 and 412, sinks a current $I_{CONTROL}$ which can be varied in order to determine the amount of delay introduced between the IN terminal and the OUT terminal.

However, the delay element of FIG. 4A tends to introduce noise to the delayed signal output at the OUT terminal because the hysteresis of the circuit is uncertain. Also, the circuit has limited bandwidth at the input of the Schmitt trigger 418 which introduces signal degradation and thus limits the tuning range of the circuit.

Figure 4B:
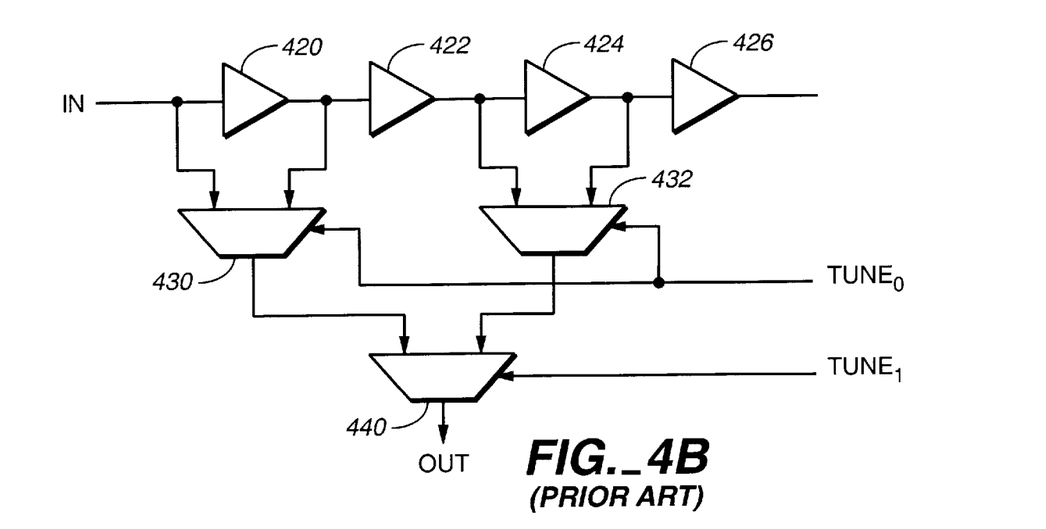
FIG. 4B is a circuit diagram of a prior art digitally-controlled variable delay element suitable for use in the continuously adjustable delay circuit of FIG. 3A.

FIG. 4B shows an example of a prior art digitally-controlled variable delay element suitable for use as one of the elements 312, 314, 316, 320, 324 or 326 in the continuously adjustable delay circuit 300 of FIG. 3A. A signal appearing at the input terminal IN passes through delay elements 420, 422, 424 and 426 which each successively introduce a fixed delay interval to the signal. A digital signal, represented in FIG. 4B by $TUNE_0$ and $TUNE_1$, controls the amount of delay introduced to the signal appearing at the OUT terminal by selecting the output of one of the delay elements 420, 422 or 424. For instance, a logic value of "11" for signals $TUNE_0$ and $TUNE_1$ will control MUXes 432 and 440 to select the output of delay element 424, which has a high amount of delay. A logic value of "00" for signals $TUNE_0$ and $TUNE_1$, in contrast, will select the signal at the IN terminal, which has a low amount of delay introduced by MUXes 430 and 440.

The timing of the control signals $TUNE_0$ and $TUNE_1$ of the delay circuit of FIG. 4B, however, is critical. If the edges of $TUNE_0$ and $TUNE_1$ are not precisely aligned then signal degradation can occur due to transient switching in MUXes 430,432 and 440. In addition, though the number of delay elements and MUXes can be increased to obtain a delay circuit capable of introducing greater delay, the resulting circuit has more layers of MUXes through which a signal must pass to reach the OUT terminal which limits the minimum delay interval to that of the delay introduced by the successive levels of MUXes and results in larger granularity in the variable delay interval.

Figure 5:
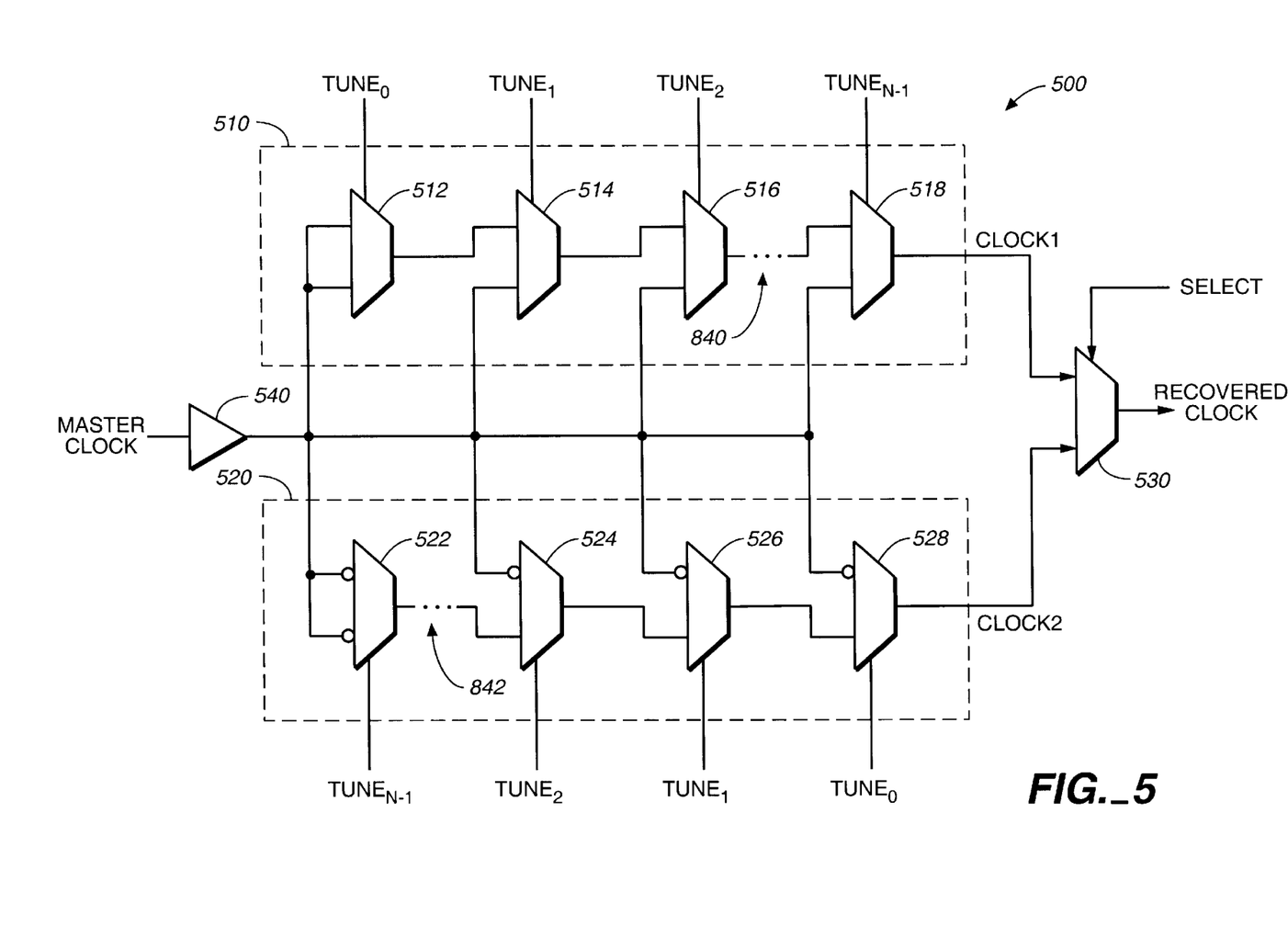
FIG. 5 is a functional block diagram of an embodiment of a digitally controlled continuously adjustable delay circuit according to the present invention.

FIG. 5 shows an embodiment of a digitally-controlled, continuously variable delay 500 according to the present invention. Clock delay path 510 is constructed from MUXes 512,514,516 and 518. Clock delay path 520 is constructed from MUXes 522, 524, 526 and 528. The MUXes act as the delay elements and the ellipses 540 and 542 indicate that the number of MUXes can be varied to match the delay needs of the particular application. The minimum delay interval is the delay introduced by MUX 518 of delay path 510 or MUX 528 of delay path 520 plus the delay of MUX 530. The delay granularity is the delay interval of an individual MUX, since the increase in delay is accomplished by routing the MASTER CLOCK signal at the input terminal through successive MUXes.

The MASTER CLOCK signal applied to the input terminal is buffered by driver 540 and input to both inputs of MUX 512, the first delay element in clock delay path 510, and MUX 522, the first delay element in clock delay path 520. Both inputs of MUX 522 are inverting inputs so as to invert the phase of the buffered MASTER CLOCK signal output from driver 540. The output of MUX 512 is input to a first input of MUX 514 while the second input of MUX 514 receives the buffered MASTER CLOCK signal. The output of MUX 522 is input to a non-inverting input of MUX 524 while an inverting input of MUX 524 receives the buffered MASTER CLOCK signal. Subsequent stages of each delay path are similarly connected. MUX 530, under the control of the SELECT signal, selects one of CLOCK1 and CLOCK2 for output as the RECOVERED CLOCK signal at the output terminal of the circuit 500.

Note that, in addition to the buffered MASTER CLOCK signal being inverted in clock delay path 520, the $TUNE_0-TUNE_{N-1}$ control signals are connected to MUXes 522, 524, 526 and 528 in the reverse order from the way $TUNE_0-TUNE_{N-1}$ are connected to MUXes 512, 514, 516 and 518. This combination results in the variable time delays of clock delay path 510 and 520 being complementary with one another responsive to the same control inputs.

Figure 6A:
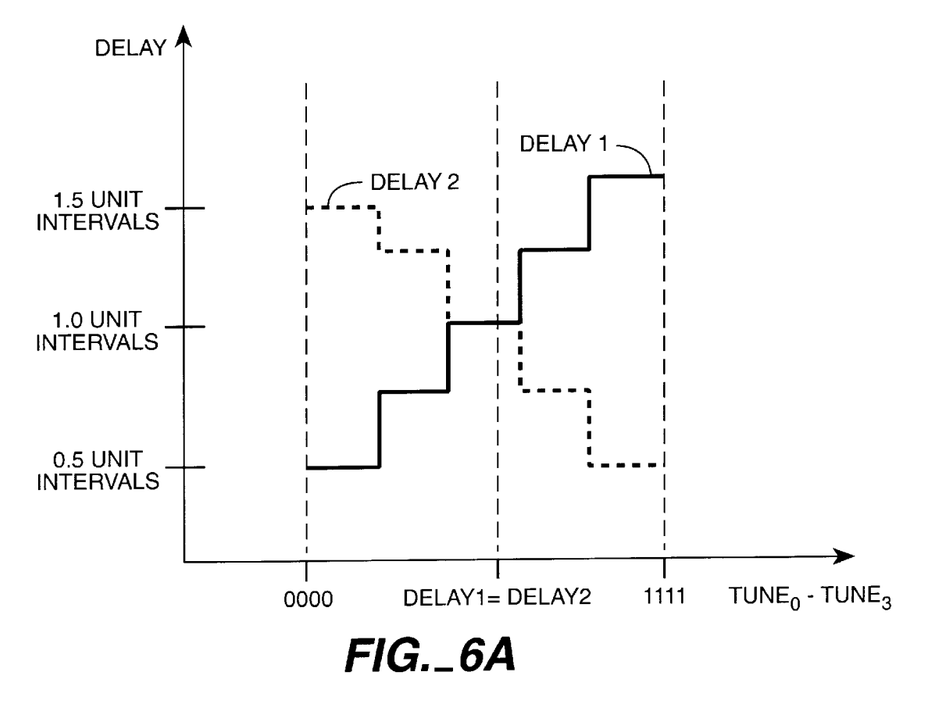
FIG. 6A is a plot of the relationship between the delay of each of the two delay paths of the digitally-controlled continuously adjustable delay circuit of FIG. 5.
Figure 7:
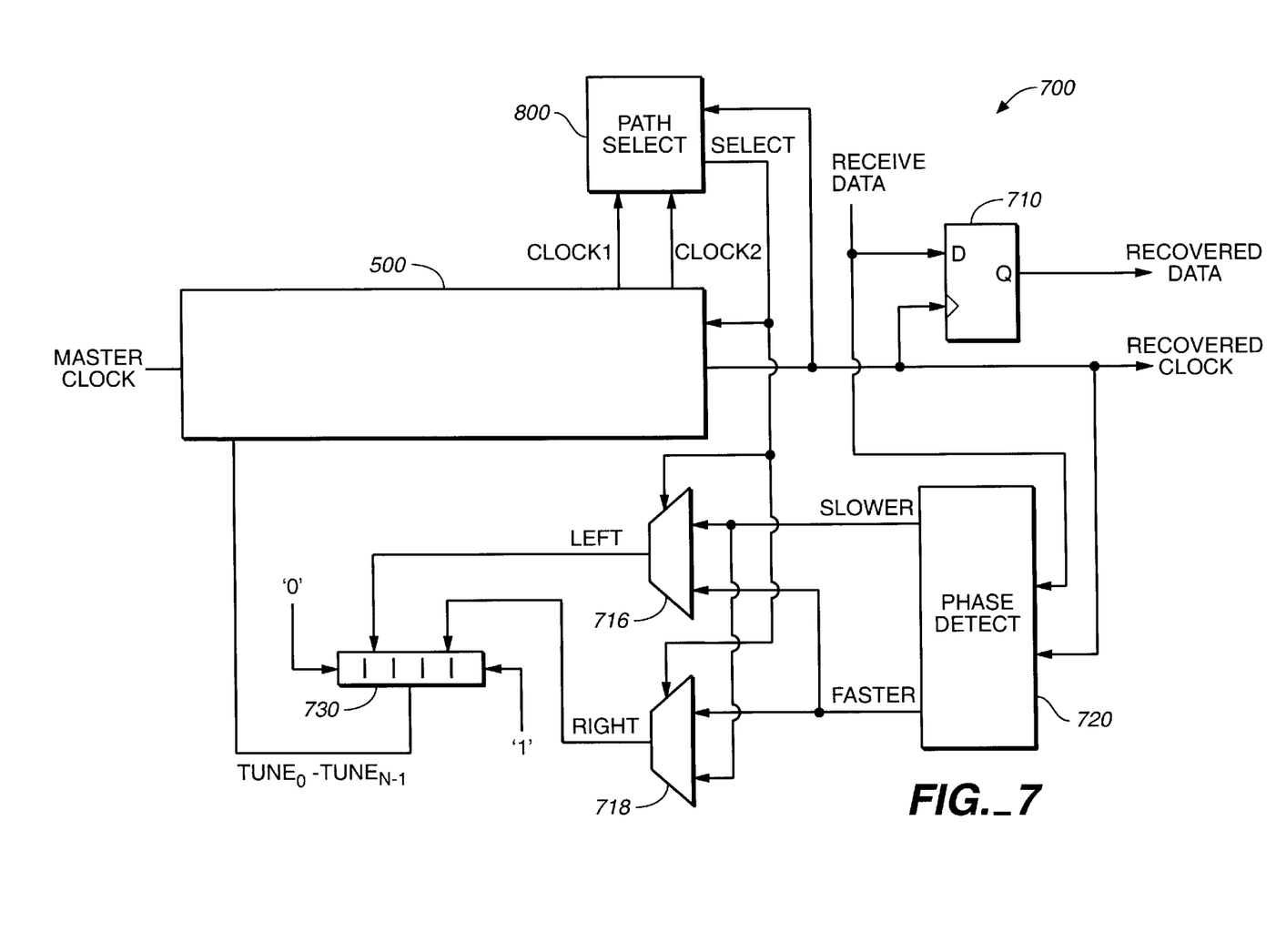
FIG. 7 is a functional block diagram of a data receiver incorporating the digitally-controlled continuously adjustable delay circuit of FIG. 5.

Using the example of N=4 in the context of shift register 730 of FIG. 7, an example of the digital logic progression in shift register 730 and digitally controlled continuously variable delay 500 is:

| MSB-LSB | DELAY1 | DELAY2 |
|---------|--------|--------|
| 0001    | lowest | highest |
| 0011    |        |        |
| 0111    |        |        |
| 1111    | highest | lowest |
| 0111    |        |        |
| 0011    |        |        |
| 0001    | lowest | highest |
| 0011    |        |        |
| 0111    |        |        |
| 1111    | highest | lowest |
| 0111    |        |        |
| 0011    |        |        |
| 0001    | lowest | highest | whereby the above sequence would accomplish a continuously increasing delay of the RECOVERED CLOCK signal relative to the MASTER CLOCK signal. Note, however, that the switchover point may not be at the end points of the digital range but will take place at a point where the digital value corresponds to a phase overlap between CLOCK1 and CLOCK2. FIG. 6A illustrates an example of the relationship between the values of $TUNE_0-TUNE_3$ and the delay of CLOCK1 (DELAY1) and the delay of CLOCK2 (DELAY2) in terms of bit cycle times (UNIT INTERVALS) of the MASTER CLOCK signal.

Figure 6B:
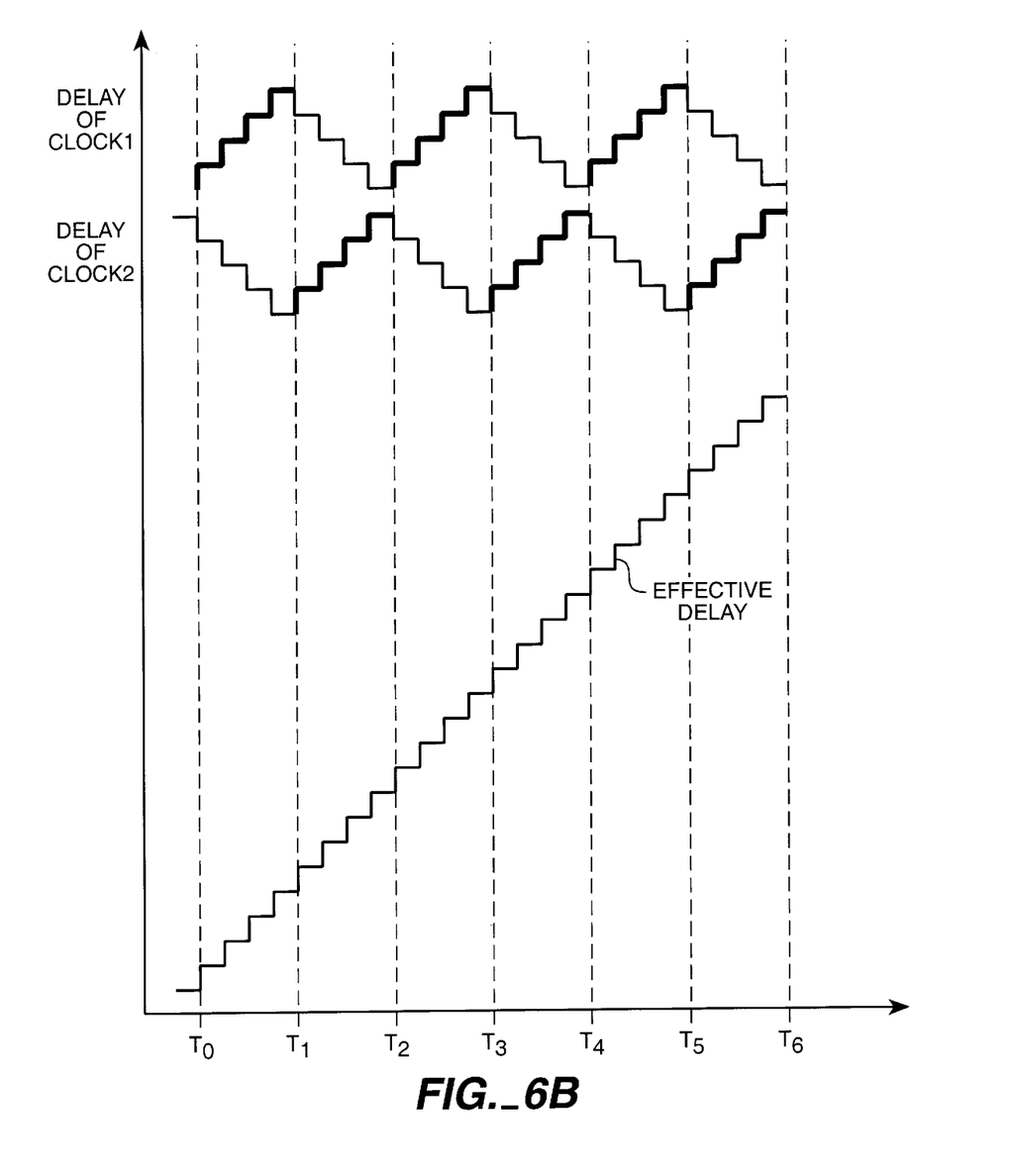
FIG. 6B is a time plot illustrating the operation of the digitally-controlled continuously adjustable delay circuit of FIG. 5.

FIG. 6B demonstrates the operation of the continuously variable delay 500 of FIG. 5 for the case of a continuously slipping data clock. The situation of a continuously advancing data clock arises when the data clock frequency of the received data is slightly lower than an ideal clock frequency, i.e. the transmit clock in the data transmitter is slightly lower than the operational frequency specified for the communications link. In this situation, the clock in the receiving device must be continuously slipped from the reference frequency (i.e. the MASTER CLOCK) in the receive device in order to compensate for the frequency difference of the transmitter clock.

In FIG. 6B, CLOCK1 is initially selected as the data clock signal at $T_0$, as illustrated by the bolded portion of the DELAY OF CLOCK1 graph, and the delay of CLOCK1 steadily increases until $T_1$. At $T_1$, $\Delta t=T$, at which point CLOCK2 is selected as the data clock signal, as represented by the bolded portion of the DELAY OF CLOCK2 graph, and the delay of CLOCK2 steadily increases until $T_2$, when, once again, $\Delta t=T$ and CLOCK1 is selected as the data clock signal. This switching process can be continued indefinitely to produce continuous tuning and obtain an EFFECTIVE CLOCK DELAY which continuously increases to slip the receive clock and accommodate the error in the transmit clock. Similarly, the process can be reversed to obtain a continuously decreasing delay to accommodate a continuously advancing transmit clock.

An embodiment of a receiver circuit 700 incorporating the continuously variable delay circuit 500 of FIG. 5 into a delay-locked loop is shown in FIG. 7. PATH SELECT circuit 800 receives CLOCK1 and CLOCK2 from continuously variable delay 500, detects the condition $\Delta t=T$ and outputs the SELECT signal accordingly. The SELECT signal controls the selection of one of CLOCK1 and CLOCK2 by MUX 530 of FIG. 5 as the RECOVERED CLOCK signal for receiver 700. The RECOVERED CLOCK drives flip flop 710, which is outside of the delay-locked loop, to latch RECEIVE DATA and output the RECOVERED DATA signal.

The SELECT signal also controls MUXes 716 and 718 in order to coordinate the polarity of signals FASTER and SLOWER output by PHASE DETECT circuit 720 with the delay path 510 or 520 of FIG. 5 currently selected to produce the clock signal output as the RECOVERED CLOCK Both RECEIVE DATA and RECOVERED CLOCK are input to PHASE DETECT circuit 720 which detects the phase difference between the RECOVERED CLOCK and the data transitions in RECEIVE DATA Responsive to the phase difference, the PHASE DETECT circuit 720 generates the FASTER signal, if RECOVERED CLOCK lags the data transitions of RECEIVE DATA, or the SLOWER signal, if RECOVERED CLOCK leads the data transitions of RECEIVE DATA.

The FASTER and SLOWER signals are effectively the feedback of the delay locked loop formed with digitally-controlled, continuously variable delay 500. MUXes 716 and 718 coordinate the polarity of the feedback with the delay path of delay circuit 500 selected by path select circuit 800. MUX 716 selects the SLOWER signal for output as the LEFT signal when delay path 510 of FIG. 5 is selected and selects the FASTER signal for output as the LEFT signal when delay path 520 of FIG. 5 is selected. Similarly, MUX 718 selects the FASTER signal for output as the RIGHT signal when delay path 510 is selected and selects the SLOWER signal for output as the RIGHT signal when delay path 510 is selected.

A shift register 730 that fills with a logical '0' value from the most significant bit (MSB) direction and a logical '1' from the least significant bit (LSB) direction generates the control signals $TUNE_0$–$TUNE_{N-1}$ which control the delay of delay paths 510 and 520 in delay circuit 500 of FIG. 5. The FASTER and SLOWER signals output from PHASE DETECTOR 520 are then coupled to the leftshift signal LEFT and rightshift signal RIGHT of shift register 730 through MUXes 716 and 718 in order to control the value stored in the shift register.

Figure 8:
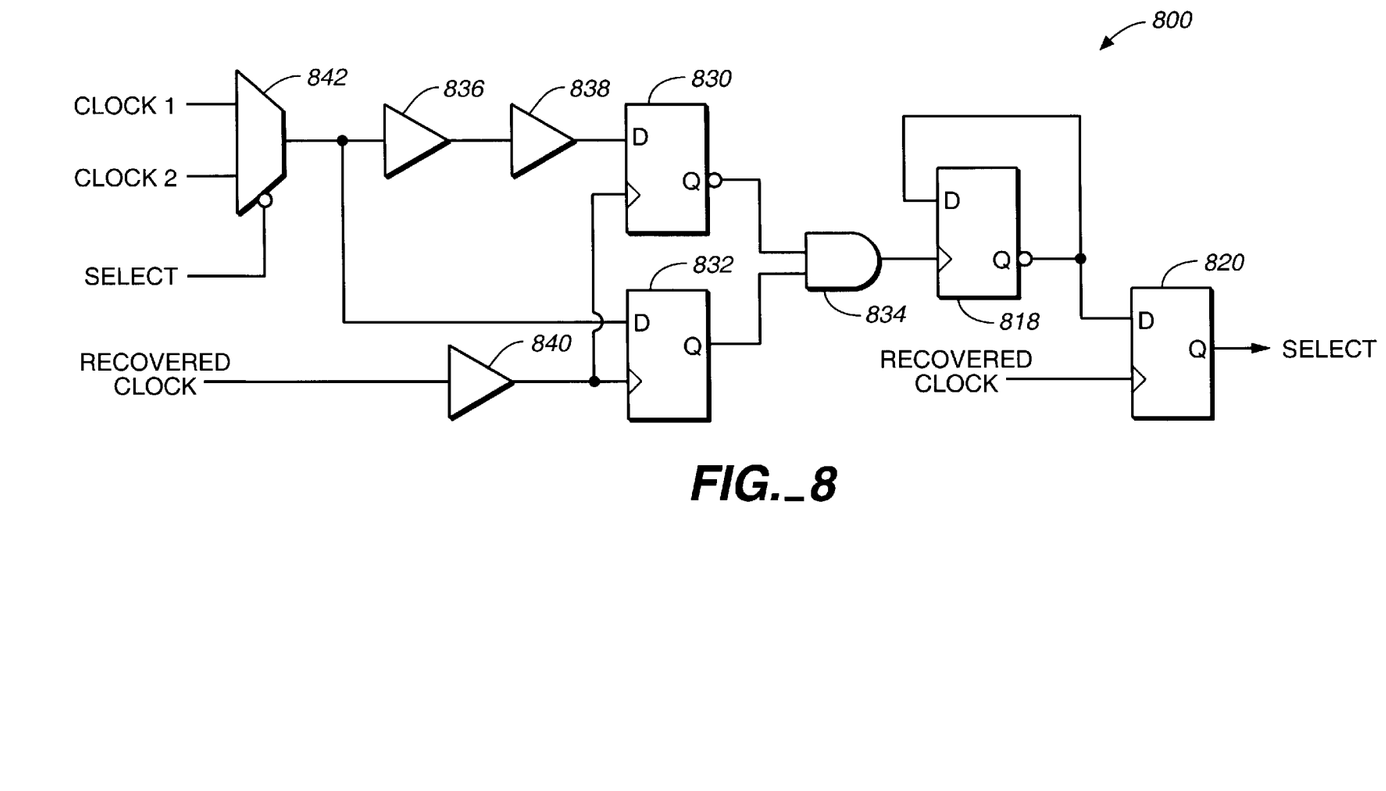
FIG. 8 is a logic diagram of an embodiment of the path select circuit of FIG. 7.

FIG. 8 shows an embodiment of the PATH SELECT circuit 800 of FIG. 7, which switches paths when the CLOCK1 and CLOCK2 signals are one bit period apart and, therefore, in-phase with one another. CLOCK1 and CLOCK2 are input to MUX 842 which selects the opposite clock signal, responsive to the current value of the SELECT signal, from the clock signal selected as the RECOVERED CLOCK responsive to the current value of the SELECT signal. The opposite clock signal is then directly connected to the D input of flip-flop 832 and connected to the D input of flip-flop 830 through short delay buffers 836 and 838. RECOVERED CLOCK is connected to the clock inputs of flip-flops 830 and 832 through short delay buffer 840. Delay buffers 836, 838 and 840 introduce a short tolerance delay to accommodate the finite granularity of the delay paths 510 and 520 of FIG. 5. The inverting output of flip-flop 830 and the non-inverting output of flip-flop 832 are input to AND gate 834 which clocks flip-flop 818 causing it to change state. The new state of flip-flop 818 is then clocked into flip-flop 820 on the next rising edge of the RECOVERED CLOCK signal in order to synchronize the change in the SELECT signal with the RECOVERED CLOCK. The PATH SELECT circuit 800 of FIG. 8 will switch the state of the SELECT signal when the rising edge of RECOVERED CLOCK signal is between the rising edge of opposite clock signal less the delay of buffer 836 and the rising edge of opposite clock signal plus the delay of buffer 838.

Figure 9A:
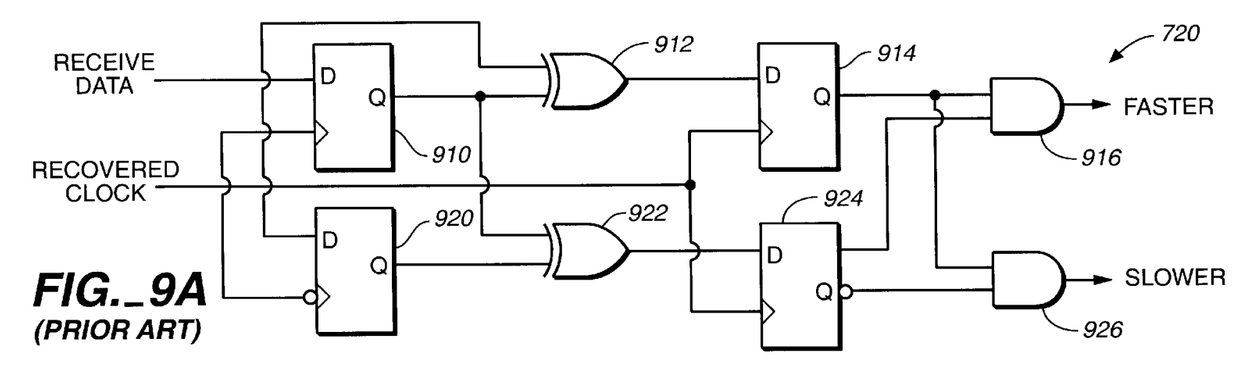
FIG. 9A is a logic diagram of an embodiment of the phase detector of FIG. 7 according to the prior art.
Figure 9B:
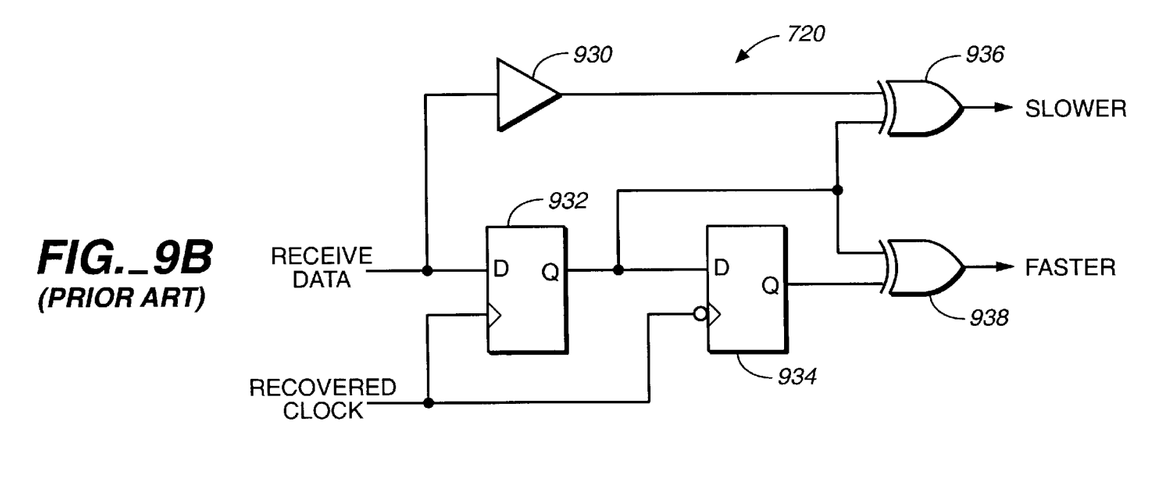
FIG. 9B is a logic diagram of another embodiment of the phase detector of FIG. 7 according to the prior art.

FIGS. 9A and 9B illustrate embodiments of PHASE DETECTOR 720 of FIG. 7. FIG. 9A shows a "bang-bang" phase detector which is well known in the art. An out of phase transition in RECEIVE DATA is clocked into flip-flop 910 by the RECOVERED CLOCK and results in the output of XOR gate 912 transitioning to a logical '1' that is clocked into flip flop 914 by the next cycle of the RECOVERED CLOCK and input into AND gates 916 and 926 to indicate that an out of phase condition exists. A determination of whether the clock lags or leads the data is made by comparing the state of the RECEIVE DATA clocked into flip-flop 910 at the rising edge of the RECOVERED CLOCK with the state of the RECEIVE DATA clocked into flip-flop 920 at the falling edge of the RECOVERED CLOCK in XOR gate 922. The result of the comparison in XOR gate 922 is clocked into flip-flop 924 by the next cycle of the RECOVERED CLOCK and the non-inverting output of flip-flop 924 is input to AND gate 916 while the inverting output is input to AND gate 926. If the phase of the RECOVERED CLOCK lags the phase of the RECEIVE DATA, then the FASTER signal output from AND gate 916 is active. If the phase of RECOVERED CLOCK leads the phase of the RECEIVE DATA, then the SLOWER signal output from AND gate 926 is active.

FIG. 9B shows a Hogge phase detector which is also well known in the art. A transition in RECEIVE DATA is clocked into flip-flop 932 by the RECOVERED CLOCK XOR gate 936 detects the phase difference between the RECEIVE DATA and the RECOVERED CLOCK signals and generates a variable width pulse as the SLOWER signal wherein the width of the pulse is proportional to the phase difference between the signals. Flip-flop 932 stores the state of the RECEIVE DATA at the previous rising edge of RECOVERED CLOCK for comparison to the state of RECEIVE DATA at the falling edge of the RECOVERED clock, captured by flip-flop 934. XOR gate 938 detects the difference in the RECEIVE DATA value between the two edges and, in response, outputs a fixed length pulse as the FASTER signal.

Having described and illustrated the principles of the invention in a preferred embodiment thereof, it should be apparent that the invention can be modified in arrangement and detail without departing from such principles. For instance, though the present invention is described in the context of a delay-locked loop for recovering a received data clock, the continuously variable delay circuit and method of the present invention is applicable in other contexts where it is desireable to adjust the phase of a signal. We claim all modifications and variations coming within the spirit and scope of the following claims.

I claim:

1. A continuously adjustable delay circuit, the circuit comprising:

a first variable delay path circuit configured to receive a clock signal and a delay control signal, wherein the first variable delay path is operable to delay the clock signal by a first variable time interval that is inversely related to the delay control signal in order to generate a first delayed clock signal;

a second variable delay path circuit configured to receive the clock signal and the delay control signal, wherein the second variable delay path is operable to delay the clock signal by the first variable time interval that is directly related to the delay control signal in a complementary manner to the delay of the first variable delay path circuit in order to generate a second delayed clock signal; and a selector circuit configured to receive the first and second delayed clock signals and being operable to select one of the first and second delayed clock signals for output as a data clock signal.

2. The continuously adjustable delay circuit of claim 1, wherein:

the first variable delay path further comprises a first plurality of delay elements, wherein the delay elements of the first plurality of delay elements are coupled in series with one another, and further wherein each one of the delay elements of the first plurality of delay elements is configured to delay the clock signal by a second variable time interval that is inversely related to the delay control signal; and the second variable delay path further comprises a second plurality of delay elements, wherein the delay elements of the second plurality of delay elements are coupled in series with one another, and further wherein each one of the delay elements of the second plurality of delay elements is configured to delay the clock signal by the second variable time interval that is directly related to the delay control signal.

3. The continuously adjustable delay circuit of claim 1, wherein the selector circuit comprises a first multiplexor, and the adjustable delay circuit further includes:

a path select circuit configured to receive the first and second delayed clock signals and generate a select signal which selects one of the first and second delayed clock signals, and wherein the path select circuit is operable to switch between the first and second delayed clock signals when the first and second delayed clock signals are separated by one bit cycle;

a flip-flop configured to receive a receive data signal and the recovered clock signal, wherein the recovered clock signal clocks the receive data signal into the flip-flop in order to obtain a recovered data signal;

a phase detect circuit configured to receive the receive data signal and the recovered clock signal, wherein the phase detect circuit is operable to generate a slower control signal when the phase of the recovered clock signal leads the phase of the received data signal and generate a faster control signal when the phase of the recovered clock signal lags the phase of the received data signal;

a control signal generator configured to receive the slower and faster control signals and the select signal and generate the delay control signal, the control signal generator being operable to adjust the delay control signal responsive to the slower and faster control signals and the select signal; and wherein the first multiplexor is configured to receive the select signal in order to select one of the first and second delayed clock signals for output as a recovered clock signal.

4. The continuously adjustable delay circuit of claim 3, wherein the control signal generator further comprises:

a second multiplexor configured to receive the faster and slower control signals and the select signal, the second multiplexor being operable to select one of the faster and slower control signals responsive to the select signal for output as an up control signal;

a third multiplexor configured to receive the faster and slower control signals and the select signal, the second multiplexor being operable to select another one of the faster and slower control signals responsive to the select signal for output as a down control signal.

5. A method for continuously adjusting a delay of a data clock signal, the method comprising the steps:

delaying a reference clock signal by a first variable time interval that is inversely related to a control signal in order to produce a first delayed clock signal;

delaying the reference clock signal by a second variable time interval that is directly related to the control signal in order to produce a second delayed clock signal;

selecting one of the first and second delayed clock signals for output as a recovered data clock;

comparing a phase of data transitions in a received data signal with a phase of the recovered data clock to determine a phase difference; and adjusting the control signal responsive to the phase difference.

6. The method of claim 5, wherein the step of selecting one of the first and second delayed clock signals for output as a recovered data clock further comprises:

switching between the first and second delayed clock signals when the first and second delayed clock signals are in phase.

7. The method of claim 5, wherein the step of adjusting the control signal responsive to the phase difference further comprises:

increasing a magnitude of the control signal when the first delayed clock signal is selected as the recovered data clock and the phase of the recovered data clock leads the phase of the received data signal;

decreasing a magnitude of the control signal when the first delayed clock signal is selected as the recovered data clock and the phase of the recovered data clock lags the phase of the received data signal;

increasing a magnitude of the control signal when the second delayed clock signal is selected as the recovered data clock and the phase of the recovered data clock lags the phase of the received data signal; and decreasing a magnitude of the control signal when the second delayed clock signal is selected as the recovered data clock and the phase of the recovered data clock leads the phase of the received data signal.

8. A continuously adjustable delay-lock loop circuit, the circuit comprising:

a first variable delay path circuit having inputs to receive a clock signal and a delay control signal, for controllably delaying the clock signal by a first variable time interval that is inversely related to the delay control signal, in order to generate a first delayed clock signal, wherein the first variable delay path circuit includes a first series of fixed delay elements coupled together in series with one another for delaying the clock signal;

a second variable delay path circuit having inputs to receive the clock signal and the delay control signal, wherein the second variable delay path is operable to delay the clock signal by a second variable time interval that is directly related to the delay control signal in order to generate a second delayed clock signal wherein, the second variable delay path circuit includes a second series of fixed delay elements coupled together in series with one another for delaying the clock signal; and the first and second variable delay paths include switches responsive to the delay control signal for selectively bypassing one or more of the fixed delay elements in each of the first and second variable delay paths so as to adjust the first and second time intervals in a complementary manner in response to the delay control signal; and a path selector for selecting one at a time of the first and second delayed clock signals for output as a recovered clock signal.

9. A continuously adjustable delay circuit according to claim 8 wherein the switches in the delay paths includes a plurality of multiplexors each connected to receive the clock signal for selectively bypassing one or more of the fixed delay elements.

10. A serial data clock recovery circuit for recovering a clock signal and serial data from a received data signal, comprising:

a delay-locked loop circuit for controllably delaying a master clock input signal so as to form the recovered clock signal;

the delay-locked loop circuit including a continuously adjustable delay circuit for adjusting a phase of the recovered clock signal so as to maintain synchrony with the received data signal; wherein the continuously adjustable delay circuit includes first and second complementary delay paths, the delay paths configured to delay the master clock input signal in a manner directly responsive to an applied tuning signal, and in a manner inversely responsive to the same tuning signal, respectively, so as to form first and second delayed clock signals, respectively, and further including a path selector circuit for selecting one at a time of the first and second delayed clock signals for output as the recovered clock signal.

11. A serial data clock recovery circuit according to claim 10 further comprising:

a phase detect circuit configured to receive the receive data signal and the recovered clock signal, for generating a slower control signal when the phase of the recovered clock signal leads the phase of the received data signal and for generating a faster control signal when the phase of the recovered clock signal lags the phase of the received data signal; and a tuning signal generator configured to receive the slower and faster control signals and a select control signal and generate the tuning signal, timing signal generator being operable to adjust the tuning signal responsive to the slower and faster control signals and the select signal so as to increase the tuning signal responsive to the slower control signal while the first delayed clock signal is selected as the recovered clock signal and conversely, decrease the tuning signal responsive to the faster control signal while the second delayed clock signal is selected as the recovered clock signal.

12. A serial data clock recovery circuit according to claim 11 wherein the tuning signal generator includes:

a first multiplexor configured to receive the faster and slower control signals and the select signal, the first multiplexor being operable to select one of the faster and slower control signals responsive to the select signal for output as an UP control signal;

a second multiplexor configured to receive the faster and slower control signals and the select signal, the second multiplexor being operable to select another one of the faster and slower control signals responsive to the select signal for output as a DOWN control signal; and a tuning voltage generating circuit configured to receive the UP and DOWN control signals, the tuning voltage generating circuit being operable to adjust the tuning signal voltage in a first direction responsive to the UP control signal and adjust the tuning signal voltage in a second direction opposite the first direction responsive to the DOWN control signal, the respective directions of voltage adjustment being selected so that the selected delayed clock signal is synchronized to the received data signal.

13. A serial data clock recovery circuit according to claim 12 wherein the tuning voltage generating circuit comprises a filter having an output connected to the continuously adjustable delay circuit to provide the tuning signal and a charge pump connected to drive the filter responsive to the selected UP and DOWN control signals.

14. A serial data clock recovery circuit according to claim 12 wherein the tuning voltage generating circuit comprises an up-down counter circuit responsive to the UP and DOWN control signals for generating a digital control word as the tuning signal for selecting delays in the first and second delay paths.

15. A serial data clock recovery circuit according to claim 12 wherein the tuning voltage generating circuit comprises a shift register connected to receive the UP and DOWN control signals for generating a digital control word as the tuning signal for selecting delays in the first and second delay paths.

16. A method for recovering a data clock signal from a serial data receive signal, the method comprising the steps of:

receiving a master clock signal having a predetermined frequency substantially equal to an expected frequency of the serial data receive signal;

delaying the master clock signal by a first variable time interval so as to form a first delayed clock signal;

delaying the master clock signal by a second variable time interval so as to form a second delayed clock signal;

selecting at a time one of the first and second delayed clock signals for output as a recovered data clock; and synchronizing the recovered data clock to the serial data receive signal.

17. A method according to claim 16 wherein the synchronizing step includes comparing a phase of data transitions in the serial data receive signal to a phase of clock edges in the recovered data clock to detect a phase difference; and wherein said delaying steps respectively include adjusting the first and second variable time intervals responsive to the detected phase difference.

18. A method according to claim 17 wherein the step of adjusting the first and second variable time intervals responsive to the detected phase difference includes;

increasing a control signal when the first delayed clock signal is selected as the recovered data clock and the phase of the recovered data clock leads the phase of the received data signal;

decreasing the control signal when the first delayed clock signal is selected as the recovered data clock and the phase of the recovered data clock lags the phase of the received data signal;

increasing the control signal when the second delayed clock signal is selected as the recovered data clock and the phase of the recovered data clock lags the phase of the received data signal; and decreasing the control signal when the second delayed clock signal is selected as the recovered data clock and the phase of the recovered data clock leads the phase of the received data signal.

19. A method according to claim 16 wherein the step of selecting one of the first and second delayed clock signals for output as a recovered data clock further comprises switching between the first and second delayed clock signals only when the first and second delayed clock signals are substantially in phase.

20. A method according to claim 16 wherein the step of selecting one of the first and second delayed clock signals for output as a recovered data clock further comprises switching between the first and second delayed clock signals only when the first and second delayed clock signals are offset by approximately one bit unit interval.

21. A serial data communications system comprising:

one or more serial data communications channels, each channel including a transmitter and a receiver for transmitting and receiving serial data signals, respectively, the receiver including a serial data recovery circuit for recovering a clock signal and serial data from the corresponding received data signal;

the serial data recovery circuit including a delay-locked loop circuit for controllably delaying a master clock input signal so as to maintain the recovered clock signal in synchrony with the received data signal;

the delay-locked loop circuit including first and second complementary delay path circuits each delaying the master clock input signal so as to form first and second delayed clock signals, respectively; and further including a path selector circuit for selecting one at a time of the first and second delayed clock signals responsive to a select control signal for output as the recovered clock signal.

* * * * *